(12) United States Patent
Uemura et al.

(10) Patent No.: US 8,035,410 B2
(45) Date of Patent: Oct. 11, 2011

(54) LATCH CIRCUIT

(75) Inventors: Taiki Uemura, Kawasaki (JP);
Yoshiharu Tosaka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/878,532

(22) Filed: Sep. 9, 2010

(65) Prior Publication Data

US 2011/0006803 A1    Jan. 13, 2011

Related U.S. Application Data

(62) Division of application No. 12/326,587, filed on Dec. 2, 2008, now Pat. No. 7,812,630, which is a division of application No. 11/635,517, filed on Dec. 8, 2006, now Pat. No. 7,474,116.

(30) Foreign Application Priority Data

May 18, 2006  (JP) .................................. 2006-139141

(51) Int. Cl.
*H03K 19/003* (2006.01)

(52) U.S. Cl. ................... 326/9; 326/12; 326/15; 326/93

(58) Field of Classification Search ........................ None
See application file for complete search history.

(56) References Cited

U.S. PATENT DOCUMENTS

| | | | |
|---|---|---|---|
| 5,504,703 A * | 4/1996 | Bansal .......................... | 365/156 |
| 6,026,011 A | 2/2000 | Zhang | |
| 6,327,176 B1 | 12/2001 | Li et al. | |
| 7,038,515 B2 | 5/2006 | Rusu et al. | |
| 7,212,056 B1 * | 5/2007 | Belov ............................ | 327/210 |
| 2006/0103442 A1 | 5/2006 | Krueger | |
| 2006/0279343 A1 | 12/2006 | Naffziger | |

FOREIGN PATENT DOCUMENTS

JP   4-170792 A   6/1992

* cited by examiner

*Primary Examiner* — Anh Tran
(74) *Attorney, Agent, or Firm* — Arent Fox LLP

(57) ABSTRACT

A latch circuit includes a feedback circuit having inverter circuits and at least two input terminals and an input circuit for inputting input signals or signals having the same phase as the input signals to the input terminals of the feedback circuit in synchronization with a clock signal. In the feedback circuit section, only when the input signals or the signals having the same phase as the input signals are input to the at least two input terminals at the same time, positive feedback using a predetermined number of amplification stages is applied to the input terminals.

2 Claims, 9 Drawing Sheets

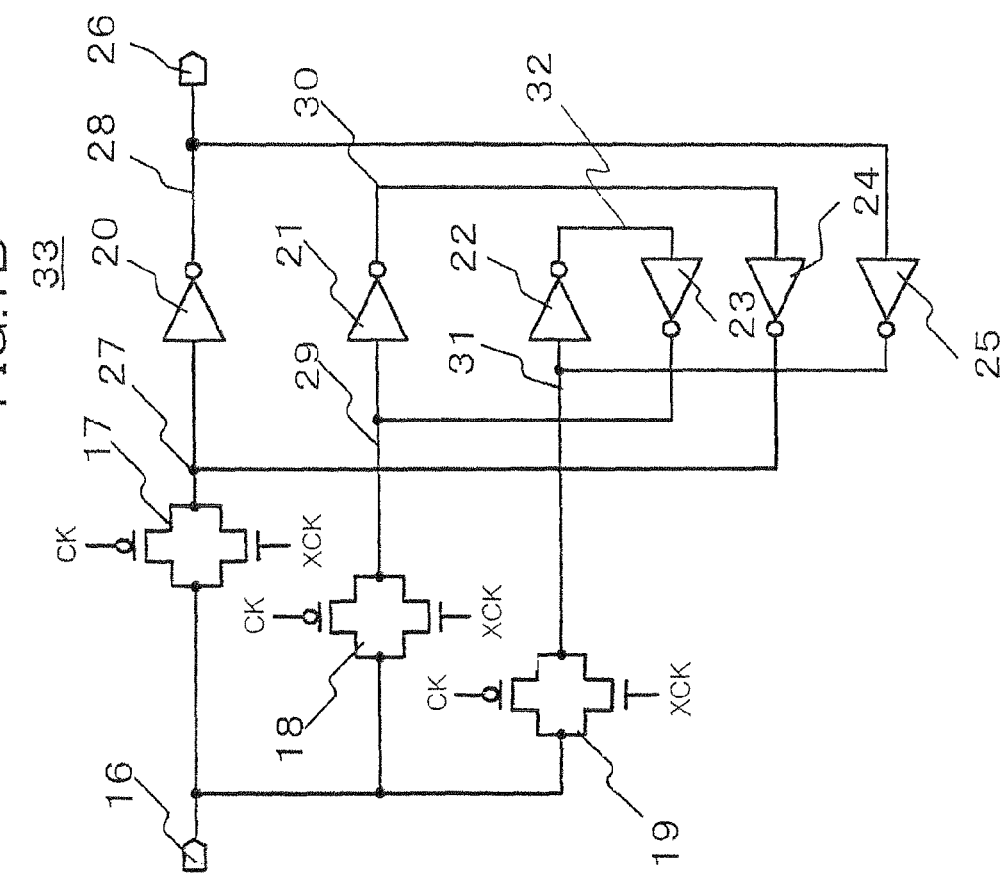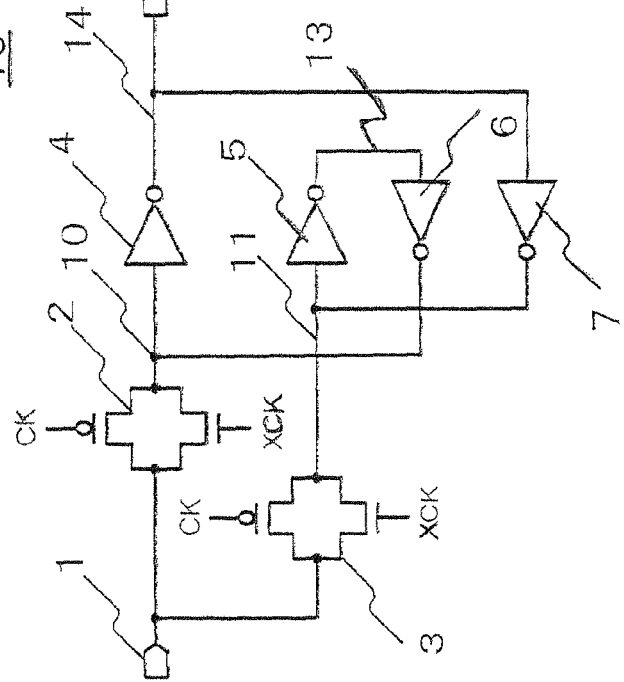

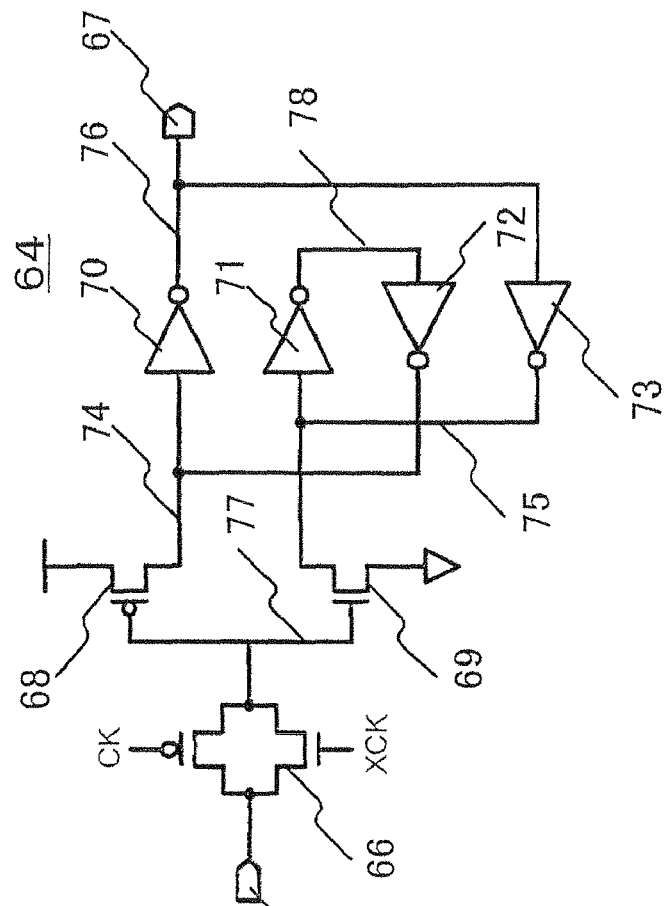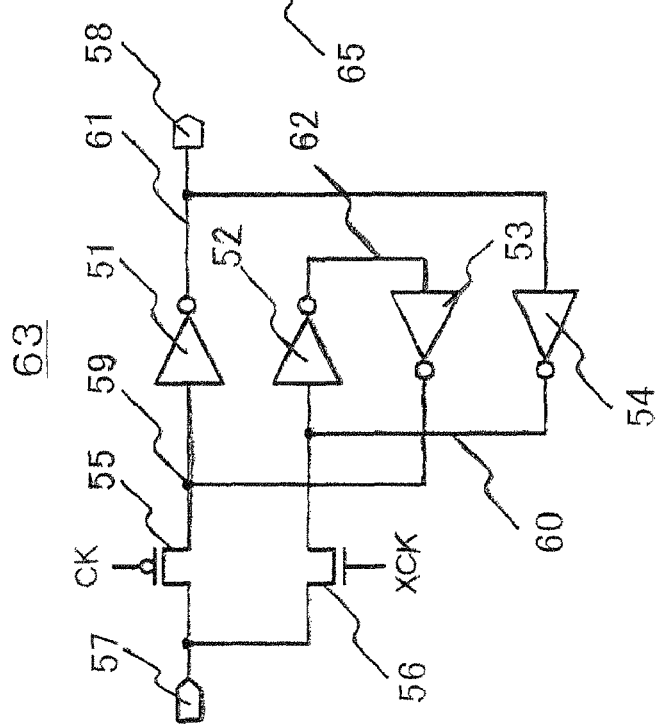
FIG. 3A
FIG. 3B

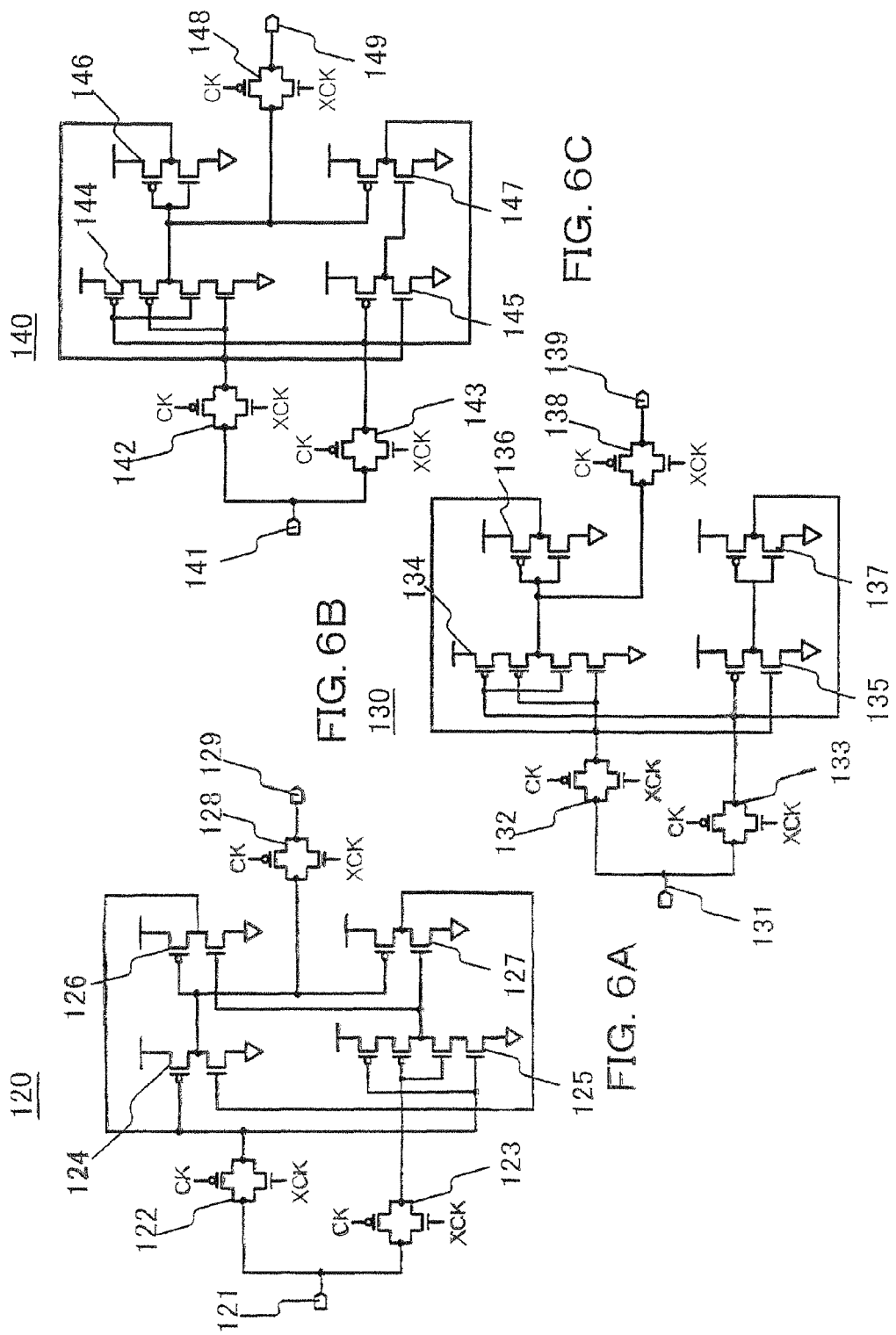

LATCH CIRCUIT

CROSS REFERENCE TO RELATED APPLICATION

This is a Divisional application, which claims the benefit of pending U.S. patent application Ser. No. 12/326,587, filed Dec. 2, 2008, which claims the benefit of pending U.S. patent application Ser. No. 11/635,517, filed Dec. 8, 2006, which also claims the benefit of Japanese Patent Application No. 2006-139141, filed May 18, 2006. The entire contents of which are incorporated herein by reference.

BACKGROUND OF THE INVENTION

1. Field of the Invention

The present invention relates to semiconductor circuits including logic circuits. In particular, the present invention relates to a semiconductor circuit including a latch circuit in which occurrence of soft error is suppressed.

2. Description of the Related Art

It has been known that α rays generated upon collapsing of radioactive isotopes contained in packages or wires in LSI (large scale integration) semiconductor circuits, neutron radiation derived from cosmic rays, and so on produce electrical noise in the LSI semiconductor circuits to thereby cause the semiconductor circuits to malfunction. error caused by failures in hardware, such as semiconductor circuits. Thus, the soft error is different from the hard error in that the soft error causes a transient malfunction in which the operation can be resumed but the hard error causes a permanent damage to a specific portion of a circuit.

However, when a transient malfunction due to soft error is stored in a latch circuit included in an SLI semiconductor circuit, the malfunction due to the soft error can become a stationary error in the semiconductor circuit.

In this case, with advancements in high-integration and microfabrication technologies and reductions in charge capacities of storage nodes in latch circuits included in LSI semiconductor circuits, the probability that a soft error resulting from the generation of electrical noise becomes a stationary error increases. This is because electrical noise facilitates the inversion of the logic states of the storage nodes of the latch circuits and thus the frequency of occurrence of malfunction states increases.

Accordingly, it has been proposed in recent years that the soft error resistance of logic LSI circuits including latch circuits is increased. For example, a method has been proposed in which parity between signals output from a latch circuit is obtained to check an error and an instruction is retried to prevent an error. However, in the error preventing method, for example, since the circuitry is configured so as to obtain parity, the number of circuits and the area of the circuitry increase, which causes a reduction in the circuitry performance.

In addition, a semiconductor circuit has been proposed in which at least three dynamic latches are prepared and wires are connected so that an output of one dynamic latch also serves as inputs of the other two dynamic latches to form three independent feedback loops (e.g., Patent Document 1: Japanese Patent Application Publication No. 4-170792).

The arrangement, however, does not increase the soft error resistance of the dynamic latches included in the feedback loops. Thus, there is a problem in that a malfunction state due to soft error in the dynamic latches becomes stationary. Accordingly, there is a problem in that, when malfunction states due to soft errors in two dynamic latches become stationary at the same time, the malfunction due to the soft errors becomes a stationary error in the semiconductor circuit.

The arrangement also requires multiple dynamic latches in order to store one storage state. Thus, there is a problem in that the area occupied by logic circuits increases or the response speed of the circuits decreases.

SUMMARY OF THE INVENTION

Accordingly, an object of the present invention is to provide a latch circuit that minimizes an increase in the area occupied by logic circuits and that increases the soft error resistance so as to prevent a decrease in the circuit response speed.

The present inventors propose the following latch circuit.

One aspect of the present invention provides a latch circuit that includes a feedback circuit having inverter circuits and at least two input terminals, and an input circuit for inputting input signals or signals having the same phase as the input signals to the input terminals of the feedback circuit in synchronization with a clock signal. In the feedback circuit section, only when the input signals or the signals having the same phase as the input signals are input to the at least two input terminals at the same time, positive feedback using a predetermined number of amplification stages is applied to the input terminals.

Another aspect of the present invention provides a latch circuit that includes a feedback circuit in which inverter circuits are connected in a ring shape and at least two input circuits. The input circuits are respectively connected to at least two connection nodes, which connect the inverter circuits of the feedback circuit, to input input signals or same-phase signals, which have the same phase as the input signals, to the connection nodes in synchronization with a clock signal. The number of amplification stages until positive feedback is applied to the input signal or the same-phase signal input to one of the connection nodes when the input signal or the same-phase signal is independently input is larger than a predetermined number of stages until positive feedback is applied to the input signal or the same-phase signal input to one of the connection nodes from the input signal or the same-phase signal input to another one of the connection nodes.

The feedback circuit included in the latch circuit applies positive feedback using a predetermined number of amplification stages to the at least two input terminals, only when input signals or signals having the same phase as the input signals are input to the input terminals at the same time.

Accordingly, even when a soft error occurs in one of the input terminals and an input signal in a malfunction state is input, no feedback is applied to the input terminal or positive feedback using a larger number of amplification stages than a predetermined number of amplification stages is applied. With this arrangement, the possibility that a malfunction state due to a soft error becomes stationary is reduced.

On the other hand, during a normal operation in which input signals are input to the at least two input terminals at the same time, positive feedback using a predetermined number of stages is applied. Thus, the response speed of the circuits does not decrease.

Accordingly, the present invention can provide a latch circuit that minimizes an increase in the area occupied by logic circuits and that increases the soft error resistance so as to prevent a decrease in the circuit response speed.

BRIEF DESCRIPTION OF THE DRAWINGS

FIGS. 1A and 1B each show a latch circuit that includes inverter circuits at four or more even number of stages and that have multiple nodes to which an input signal is input;

FIGS. 3A and 3B each show a latch circuit having a configuration in which a feedback circuit section is constituted by inverter circuits at four or more even number of stages and a signal having the same logic level as an input signal is input to a different node in the feedback circuit section;

FIGS. 6A, 6B, and 6C are circuit diagrams each showing a latch circuit according to the second embodiment, the latch circuit including a combination of the inverter circuit A shown in FIG. 4A, the inverter circuit B shown in FIG. 4B, the inverter circuit C shown in FIG. 4C, and typical inverter circuits;

DESCRIPTION OF THE PREFERRED EMBODIMENTS

Figure 2:
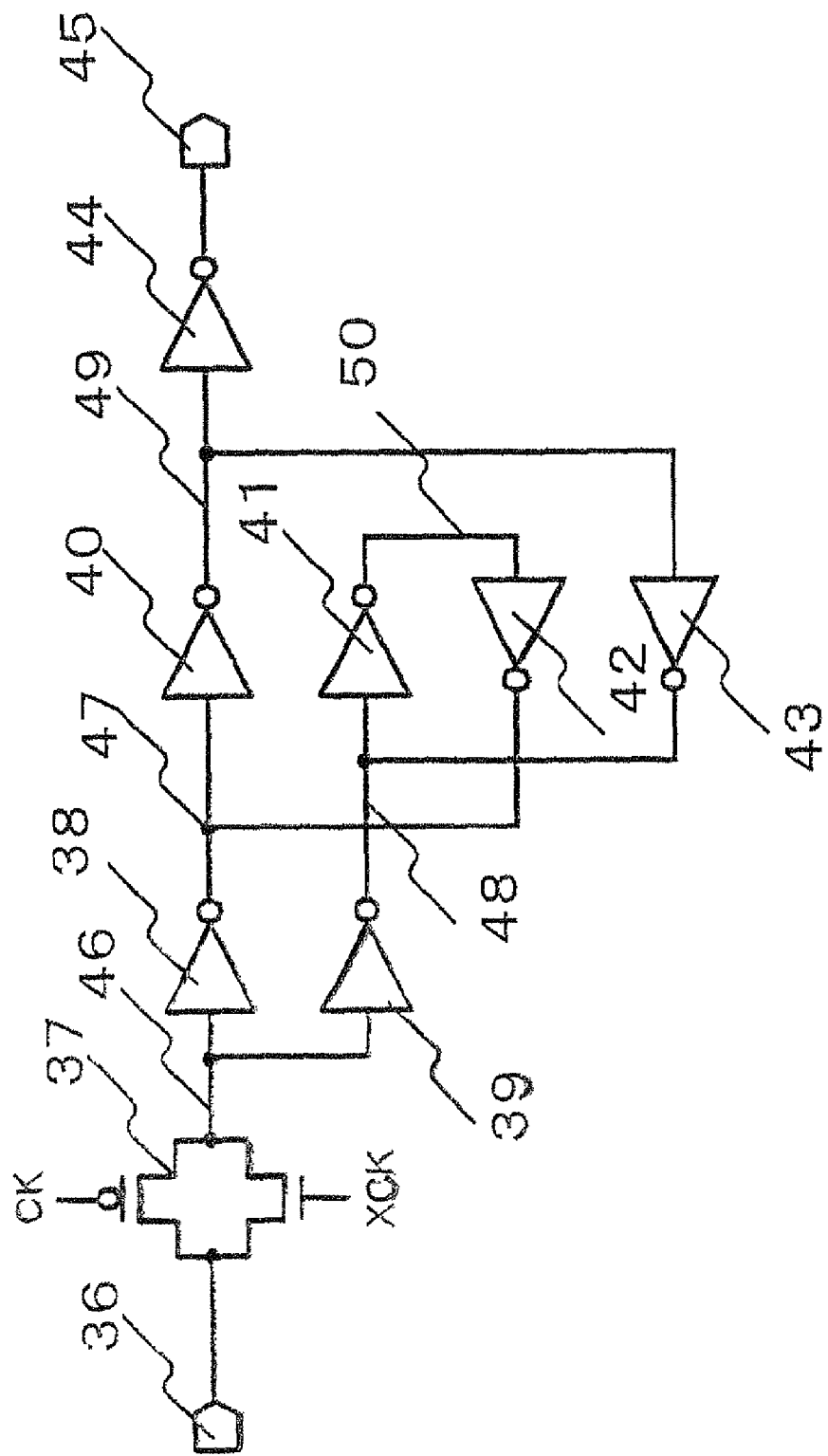
FIG. 2 shows a latch circuit having a configuration in which a feedback circuit section is constituted by inverter circuits at four or more even number of stages and an input signal is input to multiple nodes via multiple inverter circuits provided subsequent to a transfer gate.

A first embodiment, a second embodiment, a third embodiment, and a fourth embodiment will be described below.

First Embodiment

A first embodiment is directed to a latch circuit that features the use of multiple inverter circuits at four or more even number of stages to feed back signals. The first embodiment is also directed to a latch circuit having a configuration in which input signals are transmitted to multiple nodes and are fed back by two-stage inverter circuits. In the latching according to the first embodiment, since the time required for the feedback is increased, there is an advantage in that the time taken until a malfunction state occurred due to soft error becomes stationary increases. On the other hand, since the input signals are transmitted to the multiple nodes, there is an advantage in that the response speed of the latch circuit is maintained. The first embodiment will now be described with reference to FIGS. 1A, 1B, 2, 3A, and 3B.

FIGS. 1A and 1B each show a latch circuit that includes inverter circuits at four or more even number of stages and that have multiple nodes to which input signals are input.

FIG. 1A is a circuit diagram showing a latch circuit 15 that includes inverter circuits at four stages. The latch circuit 15 includes an input terminal 1, a feedback circuit section in which inverter circuits 4 to 7 are connected in a ring shape, transfer gates 2 and 3 that transmit signals from the input terminal 1 to the feedback circuit section, and an output terminal 8. In the feedback circuit section, the inverter circuit 4 is connected to the inverter circuit 7 via a node 14, the inverter circuit 7 is connected to the inverter circuit 5 via a node 11, the inverter circuit 5 is connected to the inverter circuit 6 via a node 13, and the inverter circuit 6 is connected to the inverter circuit 4 via a node 10. The transfer gate 2 connects the input terminal 1 and the node 10. The transfer gate 3 connects the input terminal 1 and the node 11. The output terminal 8 is connected to the node 14. The transfer gate refers to a transfer gate having a configuration in which an NMOS transistor and a PMOS transistor are generally connected in parallel, a clock signal (CK signal) is connected to the gate electrode of the PMOS transistor, and an inverted signal (XCK signal) of the clock signal is connected to the gate electrode of the NMOS transistor. In the transfer gate, a signal input to one end of the NMOS transistor or the PMOS transistor is output from another end thereof in synchronization with the clock signal.

FIG. 1B is a circuit diagram showing a latch circuit 33 that includes inverter circuits at six stages. The latch circuit 33 includes an input terminal 16, a feedback circuit section in which inverter circuits 20 to 25 are connected in a ring shape, transfer gates 17, 18, and 19 that transmit signals from the input terminal 16 to the feedback circuit section, and an output terminal 26. In the feedback circuit section, the inverter circuit 20 is connected to the inverter circuit 25 via a node 28, the inverter circuit 25 is connected to the inverter circuit 22 via a node 31, the inverter circuit 22 is connected to the inverter circuit 23 via a node 32, the inverter circuit 23 is connected to the inverter circuit 21 via a node 29, the inverter circuit 21 is connected to the inverter circuit 24 via a node 30, and the inverter circuit 24 is connected to the inverter circuit 20 via a node 27.

The time in which the feedback circuit section constituted by inverter circuits at four or more even number of stages, as shown in FIGS. 1A and 1B, latches signals is longer than the time in which the feedback circuit section constituted by inverter circuits at two stages latches signals. With this arrangement, even in a case in which a soft error occurs and the signal state of a node becomes a malfunction state, when the time in which the soft error is resolved is shorter than the time in which a signal in the malfunction state is latched, the soft error state does not become stationary.

On the other hand, when the time in which the feedback circuit section latches the input signals is long, the operating speed of the latch circuit decreases. In each of the latch circuits shown in FIGS. 1A and 1B, since the multiple transfer gates transmit the input signals to the multiple nodes, the input signal input to one node is positively fed back, involving predetermined two-stage amplification, from the input signal input to another node. Thus, the latch circuits shown in FIGS. 1A and 1B can achieve an input-signal latching time that is equivalent to the time in which a latch circuit constituted by inverter circuits at two stages latches input signals. This is because input signals in each latch circuit shown in FIGS. 1A and 1B go through the predetermined two-stage inverter circuits until the input signals are latched.

That is, in the latch circuits shown in FIGS. 1A and 1B, although the time of latching signals in a malfunction state is long, the time of latching input signals is equivalent to that of a typical latch circuit. The reason is that the number of amplification stages until an input signal at one connection node is positively fed back from an adjacent connection node when input signals are input to multiple connection nodes at the same time is smaller than the number of application stages until a signal in a malfunction state at one connection node of the latching section is positively fed back.

FIG. 2 shows a latch circuit having a configuration in which a feedback circuit section is constituted by inverter circuits at four or more even number of stages and input signals are input to multiple nodes via multiple inverter circuits provided subsequent to a transfer gate.

A latch circuit 35 includes an input terminal 36, a feedback circuit section in which inverter circuits 40 to 43 are connected in a ring shape, a transfer gate 37 that transmits signals from the input terminal 36 to a node 46, inverter circuits 38 and 39 that transmit the input signals from the node 47 to the feedback circuit section, an inverter circuit 44 for output, and an output terminal 45.

In the feedback circuit section, the inverter circuit 40 is connected to the inverter circuit 43 via a node 49, the inverter circuit 43 is connected to the inverter circuit 41 via a node 48, and the inverter circuit 41 is connected to the inverter circuit 42 via a node 50. The inverter circuit 38 transmits a signal from the node 46 to the node 47, and the inverter circuit 39 transmits a signal from the node 46 to the node 48. The inverter circuit 44 transmits a signal from the node 49 to the output terminal 45.

The time in which the feedback circuit section constituted by the inverter circuits at four or more even number of stages, as in the latch circuit 35 shown in FIG. 2, latches signals is longer than the time in which a feedback circuit section constituted by inverter circuits at two stages latches signals. With this arrangement, even in a case in which a soft error occurs and the signal state of a node becomes a malfunction state, when the time in which the soft error is resolved is shorter than the time in which the signal in the malfunction state is latched, the soft error state does not become stationary.

On the other hand, when the time in which the feedback circuit section latches the input signals is long, the operating speed of the latch circuits decreases. In this case, in the latch circuit 35 shown in FIG. 2, since input signals are transmitted to the nodes 47 and 48 via the inverter circuits 38 and 39, an input signal input to one node is positively feedback, involving predetermined two-stage amplification, from an input signal input to another node. Thus, the latch circuits shown in FIGS. 1A and 1B can achieve an input-signal latching time that is equivalent to the time in which a latch circuit constituted by inverter circuits at two stages latches input signals. The reason is that, in the latch circuit shown in FIG. 2, input signals go through the predetermined two-stage inverter circuits until the input signals are latched.

That is, in the latch circuit shown in FIG. 2, although the time of latching a signal in a malfunction state is long, the time of latching input signals is equivalent to that of a typical latch circuit. The reason is that the number of amplification stages until an input signal at one connection node is positively fed back from an adjacent connection node when input signals are input to the multiple connection nodes at the same time is smaller than the number of application stages until a signal in a malfunction state at one connection node of the latching section is positively fed back.

FIGS. 3A and 3B each show a latch circuit having a configuration in which a configuration in which a feedback circuit section is constituted by inverter circuits at four or more even number of stages and a signal having the same logic level as input signals is input to a different node in the feedback circuit section.

FIG. 3A shows a latch circuit having a configuration in which a feedback circuit section is constituted by inverter circuits at four or more even number of stages and input signals are input to nodes in the feedback circuit section via a transfer gate implemented with only a PMOS transistor (the transfer gate will hereinafter be referred to as a P-type transfer gate) and a transfer gate implemented with only an NMOS transfer gate (the transfer gate will hereinafter be referred to as an N-type transfer gate).

A latch circuit 63 includes an input terminal 57, a feedback circuit section in which inverter circuits 51 to 54 are connected in a ring shape, a p-type transfer gate 55 that transmits signals from the input terminal 57 to a node 59, an n-type transfer gate 56 that transmits signals from the input terminal 57 to a node 60, and an output terminal 58.

In the feedback circuit section, the inverter circuit 51 is connected to the inverter circuit 54 via a node 61, the inverter circuit 54 is connected to the inverter circuit 52 via the node 60, the inverter circuit 52 is connected to the inverter circuit 53 via the node 62, and the inverter circuit 53 is connected to node 59.

FIG. 3B shows a latch circuit having a configuration in which a feedback circuit section is constituted by inverter circuits at four or more even number of stages and signals having the same logic level as input signals are input to nodes in the feedback circuit section via a PMOS transistor and an NMOS transistor.

A latch circuit 64 includes an input terminal 65, a feedback circuit section in which inverter circuits 70 to 73 are connected in a ring shape, a transfer gate 66 that transmits signals from the input terminal 65 to a node 77, a PMOS transistor 68 having a gate electrode to which the node 77 is connected, an NMOS transistor having a gate electrode to which the node 77 is connected, and an output terminal 67.

In the feedback circuit section, the inverter circuit 70 is connected to the inverter circuit 73 via a node 76, the inverter circuit 73 is connected to the inverter circuit 71 via a node 75, the inverter circuit 71 is connected to the inverter circuit 72 via a node 78, and the inverter circuit 72 is connected to the inverter circuit 70 via a node 74.

The transfer gate 66 connects the input terminal 65 and the node 77. The PMOS transistor 68 connects a high-potential power source and the node 74. The NMOS transistor 69 connects a low-potential power source and the node 75.

When the potential at the node 77 is high, the node 75 is connected to the low-potential power source via the NMOS transistor 69, so that the potential at the node 75 goes low. Thus, due to the inverter circuit 71 and the inverter circuit 72, the potential at the node 74 becomes equal to the potential at the node 75. At this point, the PMOS transistor 68 is in an off state.

On the other hand, when the potential at the node 77 is low, the node 74 is connected to the high-potential power source via the PMOS transistor 68, so that the potential at the node 74 goes high. Thus, due to the inverter circuit 70 and the inverter circuit 73, the potential at the node 75 becomes equal to the potential at the node 74. At this point, the NMOS transistor 69 is in an off state.

According to each of the latch circuits shown in FIGS. 3A and 3B, the time in which the feedback circuit section constituted by the inverter circuits at four or more even number of stages latches signals is longer than the time in which a feedback circuit section constituted by inverter circuits at two stages latches signals. With this arrangement, even in a case in which a soft error occurs and the signal state of a node changes, when the time in which the soft error is resolved is shorter than the time in which the signal in the malfunction state is latched, the soft error state does not become stationary.

On the other hand, when the time in which the feedback circuit section latches the input signals is long, the response speed of the latch circuit decreases. In this case, in the latch circuit 63 shown in FIG. 3A and the latch circuit 64 shown in FIG. 3B, since input signals or signals having the same logic level as the input signals are transmitted to the node 60 or 75 and the node 59 or 74, an input signal input to one node is positively fed back, involving predetermined two-stage amplification, from an input signal input to the other node. Thus, the latch circuits shown in FIGS. 3A and 3B can achieve an input-signal latching time that is equivalent to the time in which a latch circuit constituted by inverter circuits at two stages latches input signals. The reason is that, in each of the latch circuits 63 and 64 shown in FIGS. 3A and 3B, input signals go through the predetermined two-stage inverter circuits until the input signals are latched.

That is, in the latch circuits shown in FIGS. 3A and 3B, although the time of latching a signal in a malfunction state is long, the time of latching input signals is equivalent to that of a typical latch circuit. This reason is that the number of amplification stages until an input signal at one connection node is positively fed back from an adjacent connection node when input signals are input to multiple connection nodes at the same time is smaller than the number of application stages until a signal in a malfunction state at one connection node of the latching section is positively fed back.

Thus, since each of the latch circuits shown in FIGS. 1A, 1B, 2, 3A, and 3B has a feedback circuit section constituted by multiple inverter circuits, the possibility that a malfunction state caused by soft error becomes a stationary error is reduced in the latch circuit. This is because the time of latching signals in the feedback circuit section is long and thus, when the time in which a malfunction state due to soft error is resolved is shorter than the time in which a signal is latched, the soft error state does not become stationary. On the other hand, when the time in which the feedback circuit section latches signals is long, the response speed of the latch circuit decreases. The latch circuit described above has an input section via which input signals or signals having the same phase as the input signals are supplied to multiple nodes in the feedback circuit section. With this arrangement, since the input signals go through the predetermined two-stage inverter circuits until the input signals are latched, the time of latching the input signals in the latch circuit described above is equivalent to that of a feedback back circuit section constituted by two-stage inverter circuits. As a result, it is possible to prevent a decrease in the response speed of the latch circuit.

Second Embodiment

A second embodiment is directed to a latch circuit having a configuration in which a feedback circuit includes an inverter circuit having two input terminals and one output terminal so as to prevent feedback from being applied to a connection node having a logic level in a malfunction state. The second embodiment is also directed to a latch circuit having a configuration in which input signals input to two input terminals are fed back using feedback paths provided by two-stage inverter circuits. In the latching according to the second embodiment, since no feedback is applied to a connection node in a malfunction state, there is an advantage in that an error caused by soft error does not become stationary. In addition, since multiple feedback paths to which input signals are input are each constituted by two-stage inverter circuits, there is an advantage in that the response speed of the latch circuit is maintained. The second embodiment will now be described with reference to FIGS. 4A, 4B, 4C, 5A, 5B, 6A, 6B, 6C, 7A, and 7B.

Figure 4C:
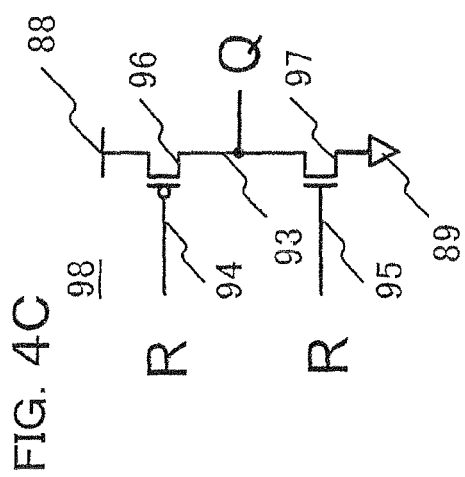
FIGS. 4A, 4B, and 4C are circuit diagrams showing inverter circuits according a second embodiment.
Figure 4A:
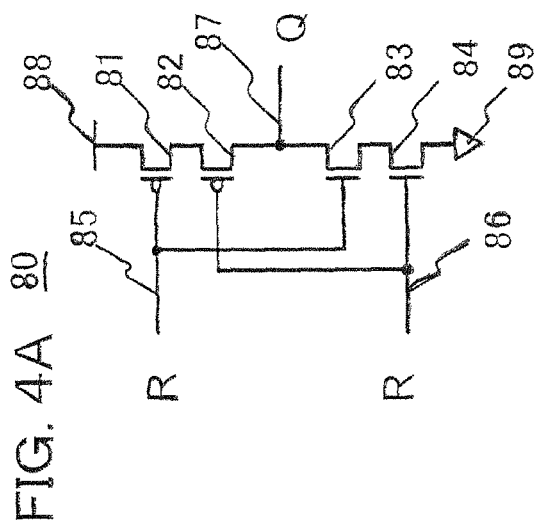
Figure 4B:
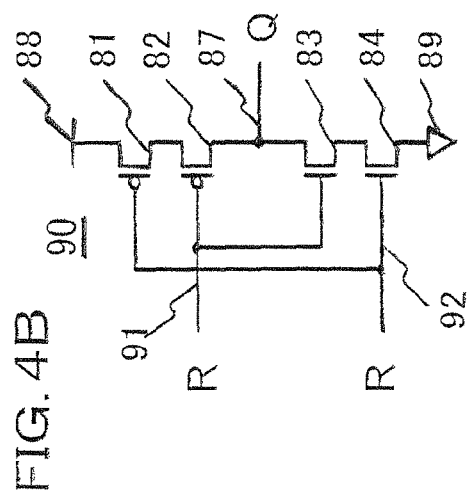

FIGS. 4A, 4B, and 4C are circuit diagrams showing inverter circuits according the second embodiment. The inverter circuits described above constitute a feedback circuit in the latch circuit of the second embodiment.

FIG. 4A is a diagram showing an inverter circuit (hereinafter referred to as an "inverter circuit A") having two input terminals 85 and 86 and one output terminal 87. An inverter circuit A80 includes PMOS transistors 81 and 82 that are connected in series between a high-potential power source 88 and an output terminal 87 and NMOS transistors 83 and 84 that are connected in series between a low-potential power source 89 and the output terminal 87. The gate electrode of the PMOS transistor 81 and the gate electrode of the NMOS transistor 83 are connected to the input terminal 85. The gate electrode of the PMOS transistor 82 and the gate electrode of the NMOS transistor 84 are connected to the input terminal 86.

With this arrangement, the inverter circuit A80 operates as follows. When high-logic input signals are input to the input terminals 85 and 86, a low-logic output signal is output to the output terminal 87. When low-logic input signals are input to the input terminals 85 and 86, a high-logic output signal is output to the output terminal 87. When a high-logic input signal is input to the input terminal 85 and a low-logic input signal is input to the input terminal 86, an indefinite-logic output signal is output to the output terminal 87. When a low-logic input signal is input to the input terminal 85 and a high-logic input signal is input to the input terminal 86, an indefinite-logic output signal is output to the output terminal 87.

FIG. 4B is a diagram showing an inverter circuit (hereinafter referred to as an "inverter circuit B") having two input terminals 91 and 92 and one output terminal 87. An inverter circuit A90 includes PMOS transistors 81 and 82 that are connected in series between a high-potential power source 88 and an output terminal 87 and NMOS transistors 83 and 84 that are connected in series between a low-potential power source 89 and the output terminal 87. The gate electrode of the PMOS transistor 81 and the gate electrode of the NMOS transistor 84 are connected to the input terminal 92. The gate electrode of the PMOS transistor 82 and the gate electrode of the NMOS transistor 83 are connected to the input terminal 91. Portions similar to those of the inverter circuit A80 shown in FIG. 4A are denoted by the same reference numbers. The inverter circuit B90 shown in FIG. 4B and the inverter circuit A80 shown in FIG. 4A are different from each other in the configurations of the input terminals 91 and 92 and the MOS transistors connected to the input terminals 91 and 92.

With this arrangement, the inverter circuit B90 operates as follows. When high-logic input signals are input to the input terminals 91 and 92, a low-logic output signal is output to the output terminal 87. When low-logic input signals are input to the input terminals 91 and 92, a high-logic output signal is output to the output terminal 87. When a high-logic input signal is input to the input terminal 91 and a low-logic input signal is input to the input terminal 92, an indefinite-logic output signal is output to the output terminal 87. In addition, when a low-logic input signal is input to the input terminal 91 and a high-logic input signal is input to the input terminal 92, an indefinite-logic output signal is output to the output terminal 87.

FIG. 4C is a diagram showing an inverter circuit (hereinafter referred to as an "inverter circuit C") having two input terminals 94 and 95 and one output terminal 93. An inverter circuit C98 includes a PMOS transistors 96 that is connected between a high-potential power source 88 and the output terminal 93 and an NMOS transistors 97 that is connected between a low-potential power source 89 and the output terminal 93. The gate electrode of the PMOS transistor 96 is connected to the input terminal 94. The gate electrode of the NMOS transistor 97 is connected to the input terminal 95.

With this arrangement, the inverter circuit C98 operates as follows. When high-logic input signals are input to the input terminals 94 and 95, a low-logic output signal is output to the output terminal 93. When low-logic input signals are input to the input terminals 94 and 95, a high-logic output signal is output to the output terminal 93. When a high-logic input signal is input to the input terminal 94 and a low-logic input signal is input to the input terminal 95, an indefinite-logic output signal is output to the output terminal 93. In addition, when a low-logic input signal is input to the input terminal 94 and a high-logic input signal is input to the input terminal 95, an indefinite-logic output signal is also output to the output terminal 93.

Figure 5B:
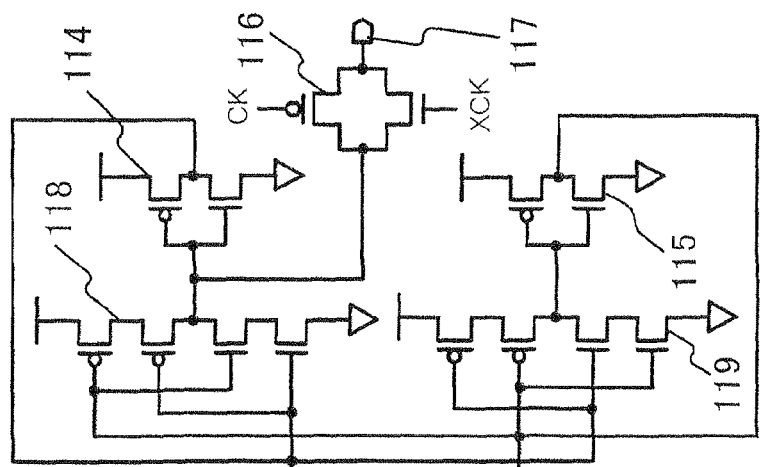
FIGS. 5A and 5B are circuit diagrams each showing a latch circuit according to the second embodiment, the latch circuit including the inverter circuit A shown in FIG. 4A, the inverter circuit B shown in FIG. 4B, and typical inverter circuits.
Figure 5A:
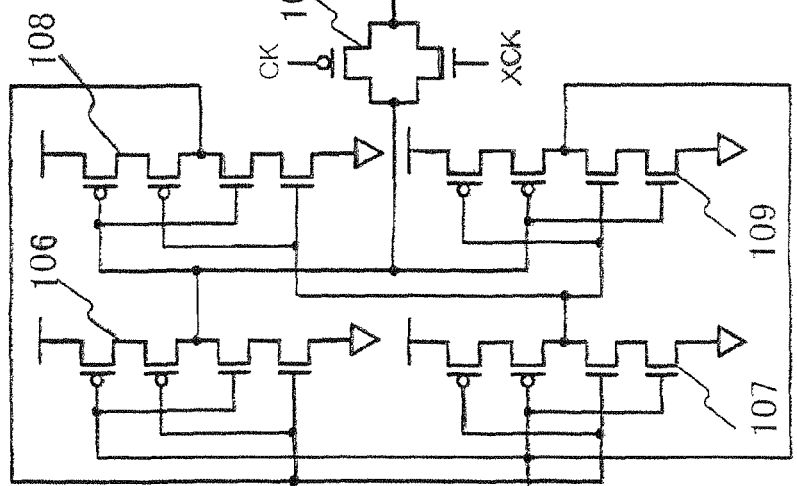

FIGS. 5A and 5B are circuit diagrams each showing a latch circuit according to the second embodiment, the latch circuit including the inverter circuit(s) A80 shown in FIG. 4A, the inverter circuit(s) B90 shown in FIG. 4B, and typical inverter circuits.

FIG. 5A is a diagram showing a latch circuit according to the second embodiment, the latch circuit including inverter circuits A and inverter circuits B. A latch circuit 100 shown in FIG. 5A includes an input terminal 101, transfer gates 102 and 103, inverter circuits A106, B107, A108, and B109, a transfer gate 104, and an output terminal 105.

The input terminal 101 is connected to one end of the transfer gate 102 and one end of the transfer gate 103. Another end of the transfer gate 102 is connected to a first input terminal of the inverter circuit A106, a second input terminal of the inverter circuit B107, and an output terminal of the inverter circuit A108. Another end of the transfer gate 103 is connected to a second input terminal of the inverter circuit A106, a first input terminal of the inverter circuit B107, and an output terminal of the inverter circuit B109. An output terminal of the inverter circuit A106 is connected to a second input terminal of the inverter circuit A108, a first input terminal of the inverter circuit B109, and one terminal of the transfer gate 104. An output terminal of the inverter circuit B107 is connected to a first input terminal of the inverter circuit A108 and a second input terminal of the inverter circuit B109. Another terminal of the transfer gate 104 is connected to the output terminal 105.

The inverter circuits A106, A108, B107, and B109 form a feedback circuit. The transfer gates 102 and 103 serve as input circuits for inputting input signals to the feedback circuit.

Input signals input to the input terminal 101 are input to the inverter circuit A106 and the inverter circuit B107 at the same time via the input circuits described above. As a result, two input terminals of the inverter circuits A106 and B107 simultaneously receive the signals having the same logic level, so that the inverter circuits A106 and B107 output inverted signals of the input signals. Thus, signals having the same logic level are input to two input terminals of the inverter circuits A108 and B109 at the same time. This is because signals output by the inverter circuits A106 and B107 are inverted signals of the input signals input to the input terminal 101. Consequently, the inverter circuits A108 and B109 output inverted signals of the input signals input thereto. That is, the inverter circuits A108 and B109 output signals having the same phase as the input signals input to the input terminal 101. Thus, signals that passed through the transfer gates 102 and 103 are subjected to positive feedback involving predetermined two-stage amplification.

FIG. 5B is a diagram showing a latch circuit according to the second embodiment, the latch circuit including an inverter circuit A, an inverter circuit B, and typical inverter circuits. A latch circuit 110 shown in FIG. 5B includes an input terminal 111, transfer gates 112 and 113, inverter circuits A118, B119, 114, and 115, a transfer gate 116, and an output terminal 117.

The input terminal 111 is connected to one end of the transfer gate 112 and one end of the transfer gate 113. Another end of the transfer gate 112 is connected to a first input terminal of the inverter circuit A118, a second input terminal of the inverter circuit B119, and an output terminal of the inverter circuit 114. Another end of the transfer gate 113 is connected to a second input terminal of the inverter circuit A118, a first input terminal of the inverter circuit B119, and an output terminal of the inverter circuit 113.

An output terminal of the inverter circuit A118 is connected to an input terminal of the inverter circuit 114 and one terminal of the transfer gate 116. An output terminal of the inverter circuit B119 is connected to an input terminal of the inverter circuit 115. Another terminal of the transfer gate 116 is connected to the output terminal 117.

The inverter circuits A118, 114, B119, and 115 form a feedback circuit. The transfer gates 112 and 113 serve as input circuits for inputting input signals to the feedback circuit.

Input signals input to the input terminal 111 are input to two input terminals of the inverter circuits A118 and B119 at the same time via the input circuits described above. As a result, two input terminals of the inverter circuits A118 and B119 simultaneously receive the signals having the same logic level, so that the inverter circuits A118 and B119 output inverted signals of the input signals. The inverter circuit 114 receives signals output from the inverter circuit A118. Consequently, the inverter circuit 114 outputs signals having the same phase as the input signals input to the input terminal 111.

Thus, signals that passed through the transfer gate 112 are subjected to positive feedback involving predetermined two-stage amplification.

On the other hand, the inverter circuit 115 receives signals output from the inverter circuit B119. Consequently, the inverter circuit 115 outputs signals having the same phase as the input signals input to the input terminal 111.

Thus, signals that passed through the transfer gate 113 are subjected to positive feedback involving predetermined two-stage amplification.

On the other hand, when a malfunction state due to soft error occurs in one of the connection nodes between the transfer gates, the inverter circuit(s) A, the inverter circuit(s) B, and the inverter circuits in the latch circuits shown in FIGS. 5A and 5B, no positive feedback is applied to the connection node at which the malfunction state occurred. The reason is that the logic levels of output signals of the inverter circuits A and B do not change unless signals having the logic level of the same phase are stimulatingly input and, therefore, the logic level in the malfunction state is not transmitted beyond the inverter circuit A or B. That is, since each connection node in the latch circuit shown in FIG. 5A is provided between the inverter circuit A or B and the inverter circuits A or B, the logic level in the malfunction state is not transmitted. Also, in the latch circuit shown in FIG. 5B, a malfunction state of each connection node to which the gate electrode of each inverter circuit is connected is transmitted by the inverter circuit. However, since the next amplification stage is the inverter circuit A or B, the malfunction state is not transmitted.

FIGS. 6A, 6B, and 6C are circuit diagrams each showing a latch circuit according to the second embodiment, the latch circuit including a combination of the inverter circuit(s) A shown in FIG. 4A, the inverter circuit(s) B shown in FIG. 4B, the inverter circuit(s) C shown in FIG. 4C, and typical inverter circuits.

FIG. 6A is a diagram showing a latch circuit according to the second embodiment, the latch circuit including the inverter circuit B and the inverter circuit C. A latch circuit 120 shown in FIG. 6A includes an input terminal 121, transfer gates 122 and 123, inverter circuits C124, B125, C126, and C127, a transfer gate 128, and an output terminal 129.

The input terminal 121 is connected to one end of the transfer gate 122 and one end of the transfer gate 113. Another end of the transfer gate 122 is connected to a first input terminal of the inverter circuit C124, a second input terminal of the inverter circuit B125, and an output terminal of the inverter circuit C126. Another end of the transfer gate 123 is connected to a second input terminal of the inverter circuit C124, a first input terminal of the inverter circuit B125, and an output terminal of the inverter circuit C127. An output terminal of the inverter circuit C124 is connected to a second input terminal of the inverter circuit C126, a first input terminal of the inverter circuit C127, and one terminal of the transfer gate 128. An output terminal of the inverter circuit B125 is connected to a first input terminal of the inverter circuit C126 and a second input terminal of the inverter circuit C127. Another terminal of the transfer gate 128 is connected to the output terminal 129.

The inverter circuits C124, B125, C126, and C127 form a feedback circuit. The transfer gates 122 and 123 serve as input circuits for inputting input signals to the feedback circuit.

The latch circuit shown in FIG. 6A is different from the latch circuit shown in FIG. 5A in that all the inverter circuits A are replaced with the inverter circuits C and one of the inverter circuits B is replaced with the inverter circuit C. The latch circuits A, B, and C are similar to each other in that two input terminals and one output terminal are provided. Thus, the latch circuit shown in FIG. 6A operates in the same manner as the latch circuit shown in FIG. 5A.

Thus, signals that passed through the transfer gate 122 are subjected to positive feedback involving predetermined two-stage amplification. Signals that passed through the transfer gate 123 are also subjected to positive feedback involving predetermined two-stage amplification.

FIG. 6B is a diagram showing a latch circuit according to the second embodiment, the latch circuit including the inverter circuit A, the inverter circuit C, and inverter circuits. A latch circuit 130 shown in FIG. 6B includes an input terminal 131, transfer gates 132 and 133, inverter circuits A134, C135, 136, and 137, a transfer gate 138, and an output terminal 139.

The input terminal 131 is connected to one end of the transfer gate 132 and one end of the transfer gate 133. Another end of the transfer gate 132 is connected to a first input terminal of the inverter circuit A134, a second input terminal of the inverter circuit C135, and an output terminal of the inverter circuit 136. Another end of the transfer gate 133 is connected to a second input terminal of the inverter circuit A134, a first input terminal of the inverter circuit C135, and an output terminal of the inverter circuit 137.

An output terminal of the inverter circuit C135 is connected to an input terminal of the inverter circuit 126 and one terminal of the transfer gate 138. An output terminal of the inverter circuit C135 is connected to an input terminal of the inverter circuit 137. Another terminal of the transfer gate 138 is connected to the output terminal 139.

The inverter circuits A134, C135, 136, and 137 form a feedback circuit. The transfer gates 132 and 133 serve as input circuits for inputting input signals to the feedback circuit.

The latch circuit shown in FIG. 6B is different from the latch circuit shown in FIG. 5B in that the inverter circuit B is replaced with the inverter circuit C. The latch circuits shown in FIGS. 6B and 5B are similar to each other in that two input terminals and one output terminal are provided. Thus, the latch circuit shown in FIG. 6B operates in the same manner as the latch circuit shown in FIG. 5B.

Thus, signals that passed through the transfer gate 132 are subjected to predetermined positive feedback by two-stage amplification. Signals that passed through the transfer gate 133 are also subjected to positive feedback involving predetermined two-stage amplification.

FIG. 6C is a diagram showing a latch circuit according to the second embodiment, the latch circuit including the inverter circuit A, the inverter circuits C, and an inverter circuit. A latch circuit 140 shown in FIG. 6C includes an input terminal 141, transfer gates 142 and 143, inverter circuits A144, C145, 146 and C147, a transfer gate 148, and an output terminal 149.

The input terminal 141 is connected to one end of the transfer gate 142 and one end of the transfer gate 143. Another end of the transfer gate 142 is connected to a first input terminal of the inverter circuit A144, a first input terminal of the inverter circuit C145, and an output terminal of the inverter circuit 146. Another end of the transfer gate 143 is connected to a second input terminal of the inverter circuit A144, a first input terminal of the inverter circuit C145, and an output terminal of the inverter circuit C147.

An output terminal of the inverter circuit A144 is connected to an input terminal of the inverter circuit 146, a first input terminal of the inverter circuit C147, and one terminal of the transfer gate 148. An output terminal of the inverter circuit C145 is connected to a second input terminal of the inverter circuit 147. Another terminal of the transfer gate 148 is connected to the output terminal 149.

The inverter circuits A144, C145, 146, and C147 form a feedback circuit. The transfer gates 142 and 143 serve as input circuits for inputting input signals to the feedback circuit.

The latch circuit shown in FIG. 6C is different from the latch circuit shown in FIG. 5A in that one of the inverter circuits A is replaced with an inverter circuit and the inverter circuit B is replaced with the inverter circuit C. The latch circuits B and C are similar to each other in that two input terminals and one output terminal are provided. The inverter circuit A and the inverter circuit are similar to each other in that inverted signals of input signals are output. Thus, the latch circuit shown in FIG. 6C operates in the same manner as the latch circuit shown in FIG. 5A.

Thus, signals that passed through the transfer gate 142 are subjected to positive feedback involving predetermined two-stage amplification. Signals that passed through the transfer gate 143 are also subjected to positive feedback involving predetermined two-stage amplification.

On the other hand, when a malfunction state due to soft error occurs in one of the connection nodes between the transfer gates, the inverter circuit(s) A, the inverter circuit B, the inverter circuits C, and the inverter circuits in the latch circuits shown in FIGS. 6A, 6B, and 6C, no positive feedback is applied to the connection node at which the malfunction state occurred. The reason is that the logic levels of output signals of the inverter circuits A, B, and C do not change unless signals having the logic level of the same phase are stimulatingly input and, therefore, the logic level in the malfunction state is not transmitted beyond the inverter circuit A, B, or C. That is, since each connection node in the latch circuit shown in FIG. 6A is provided between the inverter circuit B or C and the inverter circuit C, the logic level in the malfunction state is not transmitted. Also, in the latch circuit shown in FIG. 6B, a malfunction state of each connection node to which the gate electrode of each inverter circuit is connected is transmitted by the inverter circuit. However, since the next amplification stage is the inverter circuit A or C, the malfunction state is not transmitted. Also, in the latch circuit shown in FIG. 6C, a malfunction state of each connection node to which the gate electrode of each inverter circuit is connected is transmitted by the inverter circuit. However, since the next amplification stage is the inverter circuit A or C, the malfunction state is not transmitted.

Figures 7A, 7B:
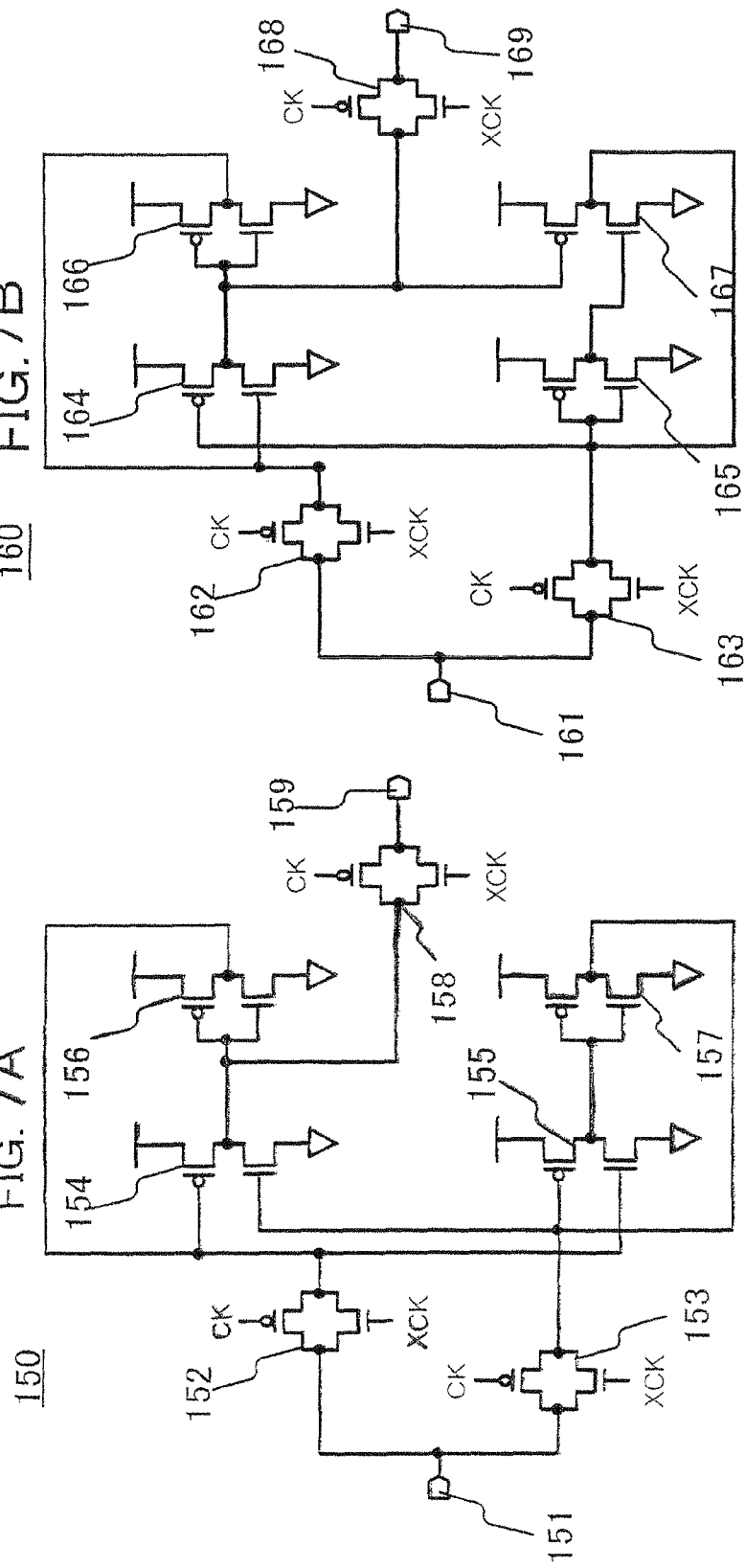
FIGS. 7A and 7B are circuit diagrams each showing a latch circuit according to the second embodiment, the latch circuit including a combination of the inverter circuits C shown in FIG. 4B and typical inverter circuits.

FIGS. 7A and 7B are circuit diagrams each showing a latch circuit according to the second embodiment, the latch circuit including a combination of the inverter circuits C shown in FIG. 4B and typical inverter circuits.

FIG. 7A is a diagram showing a latch circuit according to the second embodiment, the latch circuit including the inverter circuits C and inverter circuits. A latch circuit 150 shown in FIG. 7A includes an input terminal 151, transfer gates 152 and 153, inverter circuits C154, C155, 156, and 157, a transfer gate 158, and an output terminal 159.

The latch circuit 150 has a configuration similar to the latch circuit 130 shown in FIG. 6B. However, the latch circuit 150 is different from the latch circuit 130 in that the inverter circuit A is replaced with the inverter circuit C. Thus, the connections between circuits included in the latch circuit 150 are similar to those in the latch circuit 130 shown in FIG. 6B. Thus, the latch circuit shown in FIG. 7A operates in the same manner as the latch circuit shown in FIG. 6B.

Thus, signals that passed through the transfer gate 152 are subjected to positive feedback involving predetermined two-stage amplification. Signals that passed through the transfer gate 153 are also subjected to positive feedback involving predetermined two-stage amplification.

FIG. 7B is a diagram showing a latch circuit according to the second embodiment, the latch circuit including the inverter circuits C and inverter circuits. A latch circuit 160 shown in FIG. 7B includes an input terminal 161, transfer gates 162 and 163, inverter circuits C164, 165, 166 and C167, a transfer gate 168, and an output terminal 169.

The latch circuit 160 has a configuration similar to the latch circuit 140 shown in FIG. 6C. However, the latch circuit 160 is different from the latch circuit 140 in that the inverter circuit A is replaced with the inverter circuit C. The latch circuit 160 is also different from the latch circuit 140 in that the inverter circuit C connected to the transfer gate is replaced with the typical inverter circuit 166. Thus, the connections between circuits included in the latch circuit 160 are similar to those in the latch circuit 140 shown in FIG. 6C, except that the transfer gate 162 is not connected to the inverter circuit 165. Thus, the latch circuit shown in FIG. 7B operates in the same manner as the latch circuit shown in FIG. 6C.

Thus, signals that passed through the transfer gate 162 are subjected to positive feedback involving predetermined two-stage amplification. Signals that passed through the transfer gate 163 are also subjected to positive feedback involving predetermined two-stage amplification.

On the other hand, when a malfunction state due to soft error occurs in one of the connection nodes between the transfer gates, the inverter circuits C, and the inverter circuits in the latch circuits shown in FIGS. 7A and 7B, no positive feedback is applied to the connection node at which the malfunction state occurred. The reason is that the logic level of output signals of the inverter circuit C do not change unless signals having the logic level of the same phase are input and, therefore, the logic level in the malfunction state is not transmitted beyond the inverter circuit C. That is, in the latch circuit shown in FIG. 7A, a malfunction state of each connection node to which the gate electrode of each inverter circuit is connected is transmitted by the inverter circuit. However, since the next amplification stage is the inverter circuit C, the malfunction state is not transmitted. Also, in the latch circuit shown in FIG. 7B, a malfunction state of each connection node to which the gate electrode of each inverter circuit is connected is transmitted by the inverter circuit. However, since the next amplification stage is the inverter circuit C, the malfunction state is not transmitted.

As described above, each of the latch circuits shown in FIGS. 5A, 5B, 6A, 6B, 6C, 7A, and 7B has a feedback circuit section that includes inverter circuits having two input terminals and one output terminal. Thus, in the latch circuit described above, the possibility that a malfunction state caused by soft error becomes a stationary error is reduced. The reason is that, unless signals input to two input terminals of the inverter circuits in the feedback circuit section have the same phase at the same time, no output signal is output. That is, merely the occurrence of a malfunction state at one input terminal due to a soft error does not lead to a stationary soft-error state. On the other hand, since input signals go through the predetermined two-stage inverter circuits in the feedback circuit section until the input signals are latched, the time of latching input signals in the latch circuit described above is equivalent to that of a feedback back circuit section constituted by two-stage inverter circuits. As a result, it is possible to prevent a decrease in the response speed of the latch circuit.

Third Embodiment

A third embodiment is directed to a latch circuit having a configuration in which a feedback circuit includes an inverter circuit having two input terminals and two output terminals so as to prevent feedback from being applied to a connection node having a logic level in a malfunction state. The third embodiment is also directed to a latch circuit having a configuration in which input signals input to two input terminals are fed back involving two-stage amplification. In the latching according to the third embodiment, since no feedback is applied to a connection node in a malfunction state, there is an advantage in that an error generated by soft error does not become stationary. In addition, since feedbacks to the input terminals of the inverter circuits are implemented with predetermined two-stage inverter circuits, there is an advantage in that the response speed of the latch circuit is maintained. Now, the third embodiment will be described with reference to FIG. 8.

Figure 8:
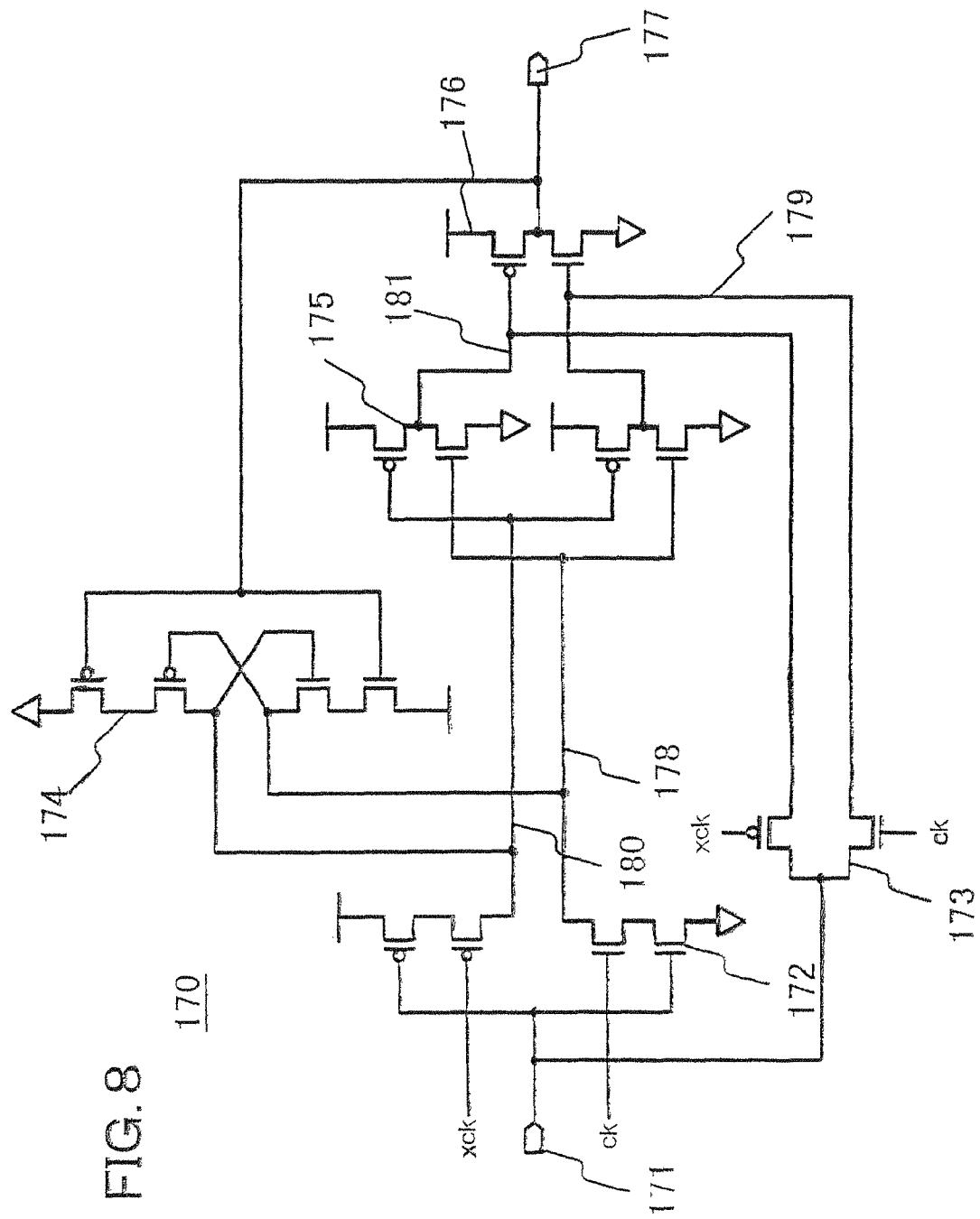
FIG. 8 is a circuit diagram showing a latch circuit according to a third embodiment.

FIG. 8 is a circuit diagram showing a latch circuit according to a third embodiment. A latch circuit 170 shown in FIG. 8 includes input terminals 171, A172, and B173, a voltage-supply circuit A174, an inverter circuit D175 having two input terminals and two output terminals, an inverter circuit C176, an output terminal 177, and nodes 178, 179, 180, and 181.

The input terminal A172 has one input terminal and two output terminals. When a signal input to the input terminal is high and a clock signal is high, one of the output terminals outputs a logic-low signal. In this case, an indefinite signal is output to the other output terminal. When a signal input to the input terminal of the input circuit A172 is low and the clock signal is low, the other terminal of the input circuit A172 outputs a logic-high signal. In this case, an indefinite signal is output to the other output terminal.

In order to allow the operation described above, the input circuit A172 has two NMOS transistors connected in series between one of the output terminals and a low-potential power source. The input terminal 171 of the latch circuit 170 is connected to the gate electrode of the NMOS transistor at the low-potential power source side. The clock signal (CK) is connected to the gate electrode of the NMOS transistor at the one-output-terminal side. Two PMOS transistors are connected in series between the other output terminal and a high-potential power source. The input terminal 171 of the latch circuit 170 is connected to the PMOS transistor at the high-potential power source side. An inverted signal (XCK) of the clock signal is connected to the gate electrode of the PMOS transistor at the other-output-terminal side.

The input circuit B173 has one input terminal and two output terminals. When a clock signal is high, logic signals similar to the signals input to the input terminal are output from the two output terminals. On the other hand, when the clock signal is low, indefinite signals are output to the two output terminals.

In order to allow the operation described above, the input terminal of the input circuit B173 is connected to one of the output terminals via a PMOS transistor. The input terminal is connected to the other output terminal via an NMOS transistor.

The voltage-supply circuit A174 has a first input terminal, a first voltage-supply terminal, and a second voltage-supply terminal. The term "voltage-supply terminal" in this case refers to a terminal in which the logic level of a voltage output from the voltage supply terminal itself is determined by the logic level of a signal input from another voltage-supply terminal.

When a signal input to the input terminal is high and a signal input to the first voltage-supply terminal is high, the logic level of a signal output from the second voltage-supply terminal is high. On the other hand, when a signal input to the input terminal is high and a signal input to the first voltage-supply terminal is low, the logic level of a signal output from the second voltage-supply terminal is indefinite.

When a signal input to the input terminal is low and a signal input to the first voltage-supply terminal is high, the logic level of a signal output from the second voltage-supply terminal is indefinite. On the other hand, when a signal input to the input terminal is low and a signal input to the first voltage-supply terminal is low, the logic level of a signal output from the second voltage-supply terminal is indefinite.

Further, when a signal input to the input terminal is high and a signal input to the second voltage-supply terminal is high, the logic level of a signal output from the first voltage-supply terminal is indefinite. On the other hand, when a signal input to the input terminal is high and a signal input to the second voltage-supply terminal is low, the logic level of a signal output from the first voltage-supply terminal is indefinite.

When a signal input to the input terminal is low and a signal input to the second voltage-supply terminal is high, the logic level of a signal output from the first voltage-supply terminal is indefinite. On the other hand, when a signal input to the input terminal is low and a signal input to the second voltage-supply terminal is high, the logic level of a signal output from the first voltage-supply terminal is low.

The voltage-supply circuit A174 has two PMOS transistors connected in series between a low-potential power source and the first voltage-supply terminal. The gate electrode of one of the PMOS transistors is connected to the input terminal. The gate electrode of the other PMOS transistor is connected to the second voltage-supply terminal. The voltage-supply circuit A174 further has two NMOS transistors connected in series between a high-potential power source and the second voltage-supply terminal. The gate electrode of one of the NMOS transistors is connected to the input terminal. The gate electrode of the other NMOS transistor is connected to the first voltage-supply terminal.

When low or high input signals are input to two input terminals of the inverter circuit D175 at the same time, each output terminal thereof outputs a signal having a logic level opposite to the input signals. When input signals having different logic levels from each other are input to two input terminals of the inverter circuit D175, each output terminal thereof outputs a signal having an indefinite logic level.

The inverter circuit D175 has two inverter circuits C. In each inverter circuit C, one of the input terminals of the inverter circuit D175 is connected to the gate electrode of the PMOS transistor and the other input terminal is connected to the gate electrode of the NMOS transistor. The PMOS transistor and the NMOS transistor are connected in series between a high-potential power supply and a low-potential power supply.

In the latch circuit shown in FIG. 8, the input terminal 171 is connected to the input terminal of the input circuit A172 and the input terminal of the input circuit B173. A first output terminal of the input circuit A172, the first voltage-supply terminal of the voltage-supply circuit A174, and a first input terminal of the inverter circuit D175 are connected to a node 180. A second output terminal of the input circuit A172, the second voltage-supply terminal of the voltage-supply circuit A174, and a second input terminal of the inverter circuit D175 are connected to a node 178. A first output terminal of the inverter circuit C175, a first input terminal of the inverter circuit C176, and a first output terminal of the input circuit B173 are connected to a node 181. A second output terminal of the inverter circuit C175, a second input terminal of the inverter circuit C176, and a second output terminal of the input circuit B173 are connected to a node 179. An output terminal of the inverter circuit C176 is connected to the output terminal 177 and the input terminal of the voltage-supply circuit A174.

In the latch circuit shown in FIG. 8, the voltage-supply circuit A174, the inverter circuit D175, and the inverter circuit C176 form a feedback circuit. As predetermined in the circuit design, the logic signals of the nodes 178 and 180 are fed back, by the inverter circuits C176 and the voltage supply circuit A174, from the logic signals of the nodes 179 and 181 via two-stage amplification. In this case, inverted signals of an input signal are input from the input circuit A172 to the nodes 178 and 180, whereas signals having the same phase as the input signal are input from the input circuit B173 to the nodes 179 and 181. With this arrangement, the inverter circuit C176 outputs a logic signal opposite to that of the signal supplied from the input terminal and the voltage-supply circuit A174 outputs a signal having the same phase as the signal supplied from the input terminal. Thus, the feedbacks from the nodes 178 and 180 to the nodes 179 and 181 are positive feedbacks.

With the arrangement described above, when an input signal is input from the input terminal 171 to the latch circuit shown in FIG. 8, the input signal is latched through two-stage amplification. Thus, the latching speed of the latch circuit is substantially the same as a typical latch circuit. The typical latch circuit in this case refers to a latch circuit having a feedback circuit in which two typical inverter circuits are connected in a ring shape.

When one of nodes including the nodes 178, 179, 180, and 181 is put into a malfunction state due to soft error, the inverter circuits D175 and C176 do not prevent the transmission of the logic signal at the node in the malfunction state to a node at the output side. The reason is that, unless input signals having the same phase are input to both the input terminals of the inverter circuits D175 and C176, no output signal is output to the output terminals.

As described above, the latch circuit shown in FIG. 8 has a feedback circuit section that includes an inverter circuit having two input terminals and two output terminals. Thus, in the latch circuit described above, the possibility that a malfunction state caused by soft error becomes a stationary error is reduced. The reason is that, unless signals input to two input terminals of the inverter circuits in the feedback circuit section have the same phase at the same time, no output signal is output. That is, merely the occurrence of a malfunction state at one input terminal due to soft error does not lead to a stationary soft-error state. In addition, since input signals go through the two-stage inverter circuits in the feedback circuit section until the input signals are latched, the time of latching input signals in the latch circuit described above is equivalent to that of a feedback back circuit section constituted by two-stage inverter circuits. As a result, it is possible to prevent a decrease in the response speed of the latch circuit.

Fourth Embodiment

A fourth embodiment is directed to a latch circuit having a configuration in which a feedback circuit includes an inverter circuit having two input terminals and two output terminals so as to prevent feedback from being applied to a connection node having a logic level in a malfunction state. The fourth embodiment is also directed to a latch circuit having a configuration in which input signals input to two input terminals are fed back involving two-stage amplification. The inverter circuit used in the fourth embodiment has a circuit configuration that is different from the inverter circuit used in the third embodiment. In the latching according to the fourth embodiment, since no feedback is applied to a connection node in a malfunction state, there is an advantage in that an error caused by soft error does not become stationary. In addition, since feedbacks to the input terminals of the inverter circuit are implemented with two-stage inverter circuits, there is an advantage in that the response speed of the latch circuit is maintained. Now, the fourth embodiment will be described with reference to FIG. 9.

Figure 9:
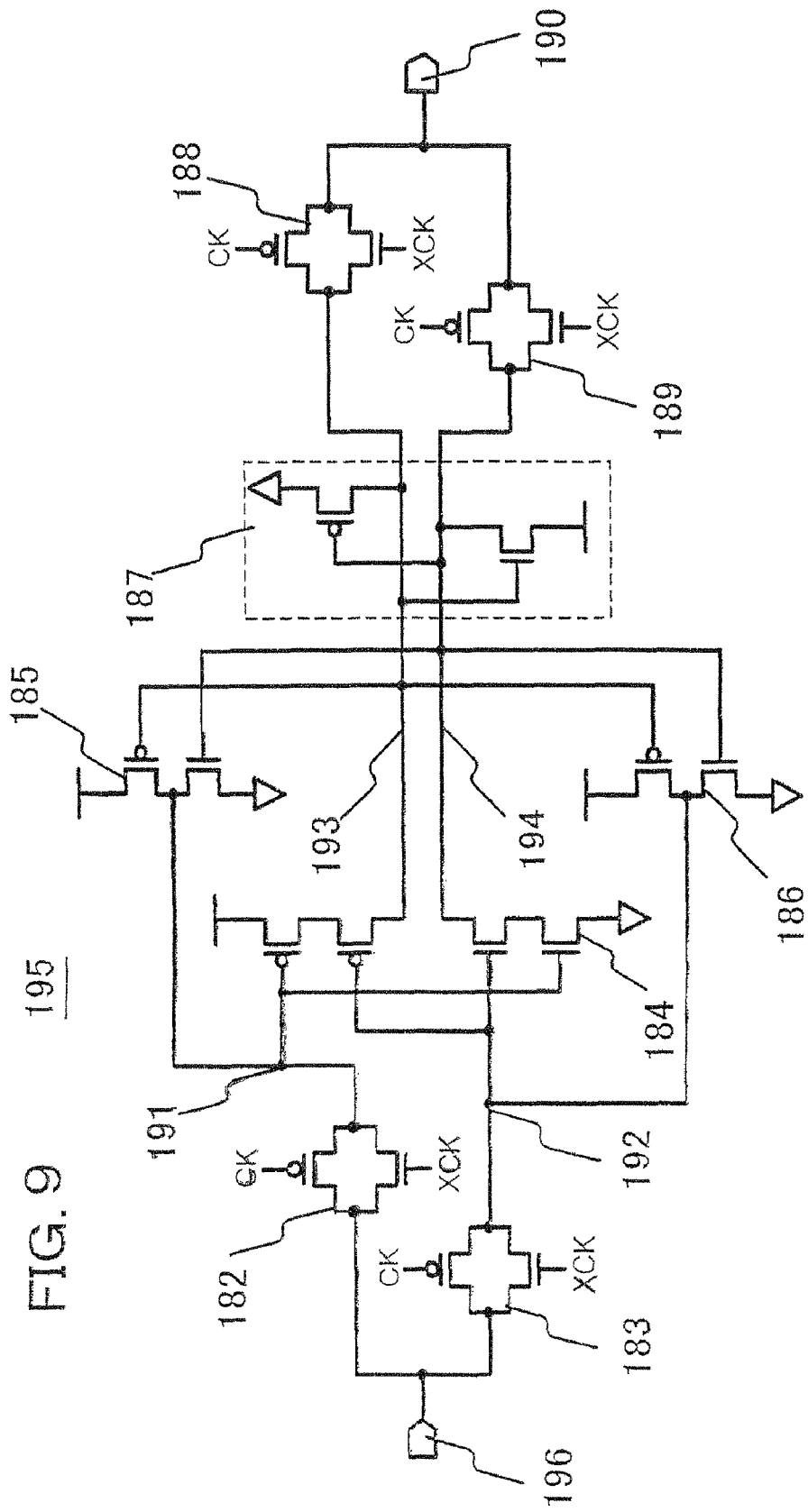
FIG. 9 is a circuit diagram showing a latch circuit according to a fourth embodiment.

FIG. 9 is a circuit diagram showing a latch circuit according to the fourth embodiment. A latch circuit 195 shown in FIG. 9 includes an input terminal 196, transfer gates 182 and 183, a signal output circuit E184 having two input terminals and two output terminals, inverter circuits C185 and C186, a voltage-supply circuit B187, transfer gates 188 and 189, an output terminal 190, and nodes 191, 192, 193, and 194.

When low-logic input signals are input to two input terminals of the signal output circuit E184 at the same time, a signal having the same phase logic level as the input signals is output from a first output terminal and the logic level of a signal output from a second output terminal becomes indefinite. When high-logic input signals are input to two input terminals of the signal output circuit E184 at the same time, a signal having the same phase logic level as the input signals is output from the second output terminal and the logic level of a signal output from the first output terminal becomes indefinite. When input signals having different logic levels from each other are input to two input terminals of the signal output circuit E184, signals having indefinite logic levels are output from the output terminals thereof.

The signal output circuit E184 has two PMOS transistors connected in series between a high-potential power source and the first output terminal and has two NMOS transistors connected in series between a low-potential power source and the second output terminal. A first input terminal of the signal output circuit E184, the gate electrode of one of the PMOS transistors, and the gate electrode of one of the NMOS transistors are connected to each other. A second input terminal of the signal output circuit E184, the gate electrode of one of the PMOS transistors, and the gate electrode of one of the NMOS transistors are connected to each other.

The voltage-supply circuit B187 has a PMOS transistor and an NMOS transistor. The gate electrode of the PMOS transistor is connected to the node 194, the drain electrode is connected to the node 193, and the source electrode is connected to a low-potential power source. The gate electrode of the NMOS transistor is connected to the node 193, the drain electrode is connected to a low-potential power source, and the source electrode is connected to the node 194.

With this arrangement, when the logic level of the node 193 is high, the voltage-supply circuit B187 supplies a high voltage to the node 193. When the logic level of the node 194 is low, the voltage-supply circuit B187 supplies a low voltage to the node 193. Thus, the voltage-supply circuit B187 supplies voltages to the respective nodes 193 and 194 so that the logic levels of the nodes 193 and 194 match each other.

In the latch circuit shown in FIG. 9, the input terminal 196 is connected to one end of the transfer gate 182 and one end of the transfer gate 183. Another end of the transfer gate 182 is connected to an output terminal of the inverter circuit C185 and the first input terminal of the signal output circuit E184. Another end of the transfer gate 183 is connected to an output terminal of the inverter circuit C186 and the second input terminal of the signal output circuit E184. The node 193 is connected to the first output terminal of the signal output circuit E184, a first input terminal of the inverter circuit C185, a first input terminal of the inverter circuit C186, an input terminal connected to the gate electrode of the NMOS transistor of the voltage-supply circuit B187, an output terminal connected to the drain electrode of the PMOS transistor of the voltage-supply circuit B187, and one end of the transfer gate 188. The node 194 is connected to the second output terminal of the signal output circuit E184, a second input terminal of the inverter circuit C185, a second input terminal of the inverter circuit C186, an input terminal connected to the gate electrode of the PMOS transistor of the voltage-supply circuit B187, an output terminal connected to the source electrode of the NMOS transistor of the voltage-supply circuit B187, and one end of the transfer gate 189. One end of the transfer gate 188 and one end of the transfer gate 189 are connected to the output terminal 190.

In the latch circuit shown in FIG. 9, the voltage-supply circuit B187, the signal output circuit E184, and the inverter circuits C185 and C186 form a feedback circuit. Positive feedbacks are applied by the inverter circuits C185 and C186 and the voltage-supply circuit B187 from the nodes 193 and 194 to the nodes 191 and 192. For example, when the logic levels of the nodes 191 and 192 are high, the logic level of the node 194 goes low. Thus, due to the operation of the voltage-supply circuit B187, the logic level of the node 193 goes low. Thus, the inverter circuits C185 and C186 apply feedback so that the logic levels of the nodes 191 and 192 go high.

In the latch circuit shown in FIG. 9, when input signals are transmitted from the input terminal 196 to the nodes 191 and 192, the signals are latched via the signal output circuit E184, the voltage supply circuit B187, and the inverter circuits C185 and C186. Thus, the latching speed of the latch circuit becomes substantially equal to that of a typical latch circuit. The typical latch circuit in this case refers to a latch circuit having a feedback circuit in which two typical inverter circuits are connected in a ring shape. The latching via the signal output circuit E184, the voltage-supply circuit B187, and the inverter circuits C185 and C186 are predetermined in the circuit design.

When one of nodes including the nodes 191, 192, 193, and 194 is put into a malfunction state due to a soft error, the signal output circuit E184 and the inverter circuits C185 and C176 do not permit the transmission of the logic signal at the node in the malfunction state to a node at the output side. The reason is that, unless input signals having the same phase are input to both the input terminals of the signal output circuit E184 and the inverter circuits C185 and C186, no output signal is output to the output terminals.

As described above, the latch circuit shown in FIG. 9 has a feedback circuit section that includes an inverter circuit having two input terminals and two output terminals. Thus, in the latch circuit described above, the possibility that a malfunction state caused by soft error becomes a stationary error is reduced. The reason is that, unless signals input to two input terminals of the inverter circuits in the feedback circuit section have the same phase at the same time, no output signal is output. That is, merely the occurrence of a malfunction state at one input terminal due to soft error does not lead to a stationary soft-error state. In addition, since input signals go through the three circuits in the feedback circuit section until the input signals are latched, the time of latching input signals in the latch circuit described above is substantially the same as that of a feedback back circuit section constituted by two-stage inverter circuits. As a result, it is possible to prevent a decrease in the response speed of the latch circuit.

What is claimed is:

1. A latch circuit comprising:
    a feedback circuit in which inverter circuits are connected in a ring shape; and
    a first input circuit for inputting a first signal to the feedback circuit, the first signal being input in synchronization with a clock signal; and
    a second input circuit for inputting a second signal to the feedback circuit, the second signal being input in synchronization with the clock signal, the second signal having same phase as the first signal,
    wherein a first number of amplification stages is defined as a number of amplification stages of the feedback circuit for positive feedback about the first signal or the second signal by the feedback circuit if the first signal is input to the feedback circuit only or if the second signal is input to the feedback circuit only,
    wherein a second number of amplification stages is defined as a number of amplification stages of the feedback circuit for positive feedback about the first signal by inputting the second signal to the feedback circuit, or a number of amplification stages of the feedback circuit for positive feedback about the second signal by inputting the first signal to the feedback circuit, and
    wherein the first number of amplification stages is larger than the second number of amplification stages.

2. The latch circuit according to claim 1, wherein the second number of amplification stages is two.

* * * * *